(12) United States Patent
Swain

(10) Patent No.: US 7,532,139 B2
(45) Date of Patent: May 12, 2009

(54) SYSTEM AND METHOD FOR CONVERTING ANALOG VALUES INTO DIGITAL FORM

(75) Inventor: Allan L. Swain, Whitmore, CA (US)

(73) Assignee: VNS Portfolio LLC, Cupertino, CA (US)

( * ) Notice: Subject to any disclaimer, the term of this patent is extended or adjusted under 35 U.S.C. 154(b) by 0 days.

(21) Appl. No.: 11/890,539

(22) Filed: Aug. 6, 2007

(65) Prior Publication Data

US 2009/0040085 A1 Feb. 12, 2009

(51) Int. Cl.
H03M 1/66 (2006.01)
(52) U.S. Cl. .................... 341/144; 341/120
(58) Field of Classification Search ............ 341/120, 341/155, 164, 144
See application file for complete search history.

(56) References Cited

U.S. PATENT DOCUMENTS

| 3,905,028 | A | * | 9/1975 | Wintz et al. | 341/138 |
|---|---|---|---|---|---|
| 3,978,472 | A | * | 8/1976 | Jones | 341/118 |
| 5,502,440 | A | * | 3/1996 | New | 341/157 |
| 5,907,299 | A | | 5/1999 | Green et al. | 341/143 |
| 5,963,044 | A | | 10/1999 | Shäfer | 324/713 |
| 6,351,231 | B1 | | 2/2002 | Price et al. | 341/155 |
| 7,382,309 | B2 | * | 6/2008 | Kim et al. | 341/164 |

FOREIGN PATENT DOCUMENTS

JP  2004-304413  10/2004

* cited by examiner

Primary Examiner—Brian Young
(74) Attorney, Agent, or Firm—Henneman & Associates, PLC; Larry E. Henneman, Jr.

(57) ABSTRACT

A method for converting analog values into digital form comprises comparing a current analog sample value with an analog input value to produce an outcome, generating a count value based on the outcome, the count value increasing upon successive like outcomes and being reset to an initial count value upon successive unlike outcomes, adding or subtracting the count value to/from a current digital sample value to generate a next digital sample value, the adding or subtracting being based on the outcome, and converting the next digital sample value to the current analog sample value.

20 Claims, 5 Drawing Sheets

SYSTEM AND METHOD FOR CONVERTING ANALOG VALUES INTO DIGITAL FORM

COPYRIGHT NOTICE

A portion of the disclosure of this patent document contains material which is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

TECHNICAL FIELD

This invention relates generally to electronic circuits and more particularly provides a system and method for converting analog values into digital form.

BACKGROUND

An analog-to-digital converter (ADC) is an electronic circuit that converts continuous, i.e., analog, signals to discrete digital numbers. ADCs are in common usage in various fields of electronics and are typically an essential part of most sampled data systems in which they act as a fundamental bridge between the analog and digital domains.

Although ADCs perform substantially the same function, they may do so in different ways. Various types of ADCs exist, their classification being based, at least in some instances, on the manner in which the conversion function is implemented. One way of classifying ADCs is as serial or parallel converters. In parallel converters, the conversion process is completed as a single process within one 'sample time' at the conclusion of which the output is produced. Such converters are also called flash converters or direction conversion ADCs. Flash converters typically employ multiple comparators, each comparing the input to a specific reference voltage simultaneously. The parallel output from a flash converter is encoded from the pattern of comparator outputs at each conversion period in pulse code modulation (PCM) form.

In serial converters, the individual bits of the PCM result are computed over several periods of a reference clock typically from the most significant bit (MSB) to the least significant bit (LSB). Traditional successive approximation converters tend to use a comparator to generate a single serial bit at a time, in a sequence from MSB to LSB, which represents the converted PCM value in digital form. The conversion time may be determined by multiplying the total loop settling time for a stable comparison with the number of bits of precision required.

A sub-classification of serial converters is a sigma-delta type ADC, which uses a single comparator but relies on over-sampling and digital processing to compute a more precise result from repetitive samples of the same input. Stigma-delta converters typically over-sample by one or two orders of magnitude and may produce up to 24-bit results.

Other types of ADCs exist as well. There are, for instance, also hybrid ADC implementations. An example of a hybrid ADC is one that uses more than one stage of flash conversion with pipelined sample/hold and comparison circuitry to gain higher conversion rates.

Conventionally, ADCs tend to be monotonic both in conversion linearity and in sample rate. Essentially, a monotonic function is one that preserves the order. For example, a monotonically increasing function is such that, as time increases, so does the function. Similarly, a monotonically decreasing function is such that, as time increases, the function decreases. Monotony in the sample rate describes a constant frequency of conversion.

There is a need for designing converters having improved performance. One desired aspect of such design may include non-monotonic performance. Another desired aspect may include substantially decreasing conversion times.

SUMMARY

In accordance with an embodiment, the present invention provides a method for converting analog values into digital form. The method comprises comparing a current (i.e., most recent) analog sample value with an analog input value to produce an outcome, generating a count value based on the outcome, adding or subtracting the count value to/from a current digital sample value, and converting the next digital sample value to a new current analog sample value, which then replaces the previous current analog sample value. The count value increases upon successive like outcomes and is reset to an initial count value upon successive unlike outcomes. The adding or subtracting is based on the outcome. The method may further include repeating the steps of comparing, generating, adding or subtracting, and converting until the current analog sample value reaches an oscillatory state dithering around the analog input value.

In such method, each new current digital sample value may become the current analog sample value in a successive iteration of the repeating steps unless a reset signal is received. The dithering state around the analog input value may be reached when at least three successive unlike outcomes have occurred. The count value may be computed based on a constant function, a linear function, an exponential function, a logarithmic function, or any combination thereof.

The method may select the step of adding when the analog sample value is less than the analog input value and may select the step of subtracting when the analog sample value is greater than the analog input value. Generating the next digital sample value may include limiting the next digital value to below an upper limit, above a lower limit, or both. Generating the count value may include limiting the count value to below an upper limit, above a lower limit, or both.

In accordance with yet another embodiment, the present invention provides a device for converting analog values into digital form. The device comprises a comparator, a count generator, a digital accumulator and a digital-to-analog converter. The comparator is adapted for comparing a current analog sample value with an analog input value to produce an outcome. The count generator is adapted for computing a count value based on the outcome. The count value increases upon successive like outcomes and is reset to an initial count value upon successive unlike outcomes. The digital accumulator is adapted for receiving the count value and for adding or subtracting the count value to/from the current digital sample value to generate a next digital sample value. The adding or subtracting is based on the outcome. The digital-to-analog converter is adapted for converting the next digital sample value to a new current analog sample value.

The device may further comprise a control circuit for determining when at least three successive unlike outcomes have occurred, thereby determining that a dithering state around the analog input value has been reached.

In such device, the digital accumulator may use the next digital sample value as the current digital sample value in a successive iteration unless the digital accumulator receives a reset signal. The digital accumulator may be adapted for generating the next digital sample value subject to an upper limit, a lower limit, or both. The count generator may be adapted for generating the count value based on a constant function, a linear function, a non-linear function, an exponential function, a logarithmic function, or any combination thereof. The count generator may be adapted for generating the count value subject to an upper limit, a lower limit, or both. The control circuit may be adapted for resetting the digital accumulator and the count generator.

Moreover, the digital accumulator may add the count value when the analog sample value is lesser than the analog input value and may subtract the count value when the analog sample value is greater than the analog input value. The control circuit may determine whether the current analog sample value has overshot or undershot the analog input value and, if so, may instruct the count generator to reset. The control circuit may determine whether a new analog input value has been received and, if so, may instruct the digital accumulator to reset.

The device may further comprise a sample/hold circuit for holding the analog input value constant during a conversion time. The conversion time may correspond to a time required to reach the dithering state around the analog input value.

DETAILED DESCRIPTION

The following description is provided to enable any person skilled in the art to make and use the invention and is provided in the context of a particular application. Various modifications to the embodiments are possible, and the generic principles defined herein may be applied to these and other embodiments and applications without departing from the spirit and scope of the invention. Thus, the invention is not intended to be limited to the embodiments and applications shown, but is to be accorded the widest scope consistent with the principles, features and teachings disclosed herein.

Embodiments of the present invention contemplate design of devices for converting analog values into digital form. One approach provides a device capable of performing the analog-to-digital conversion by way of successive approximation. The conversion time may be a function of the difference between successive analog values converted to digital form. The conversion process may be non-monotonic, such as converging exponentially on the final value. In one embodiment, such convergence may be obtained by a series of comparisons without necessarily producing the output of a single bit at a time. Such design may achieve performance improvements including non-monotonic performance, substantially decreased convergence times, or both.

Figure 1:
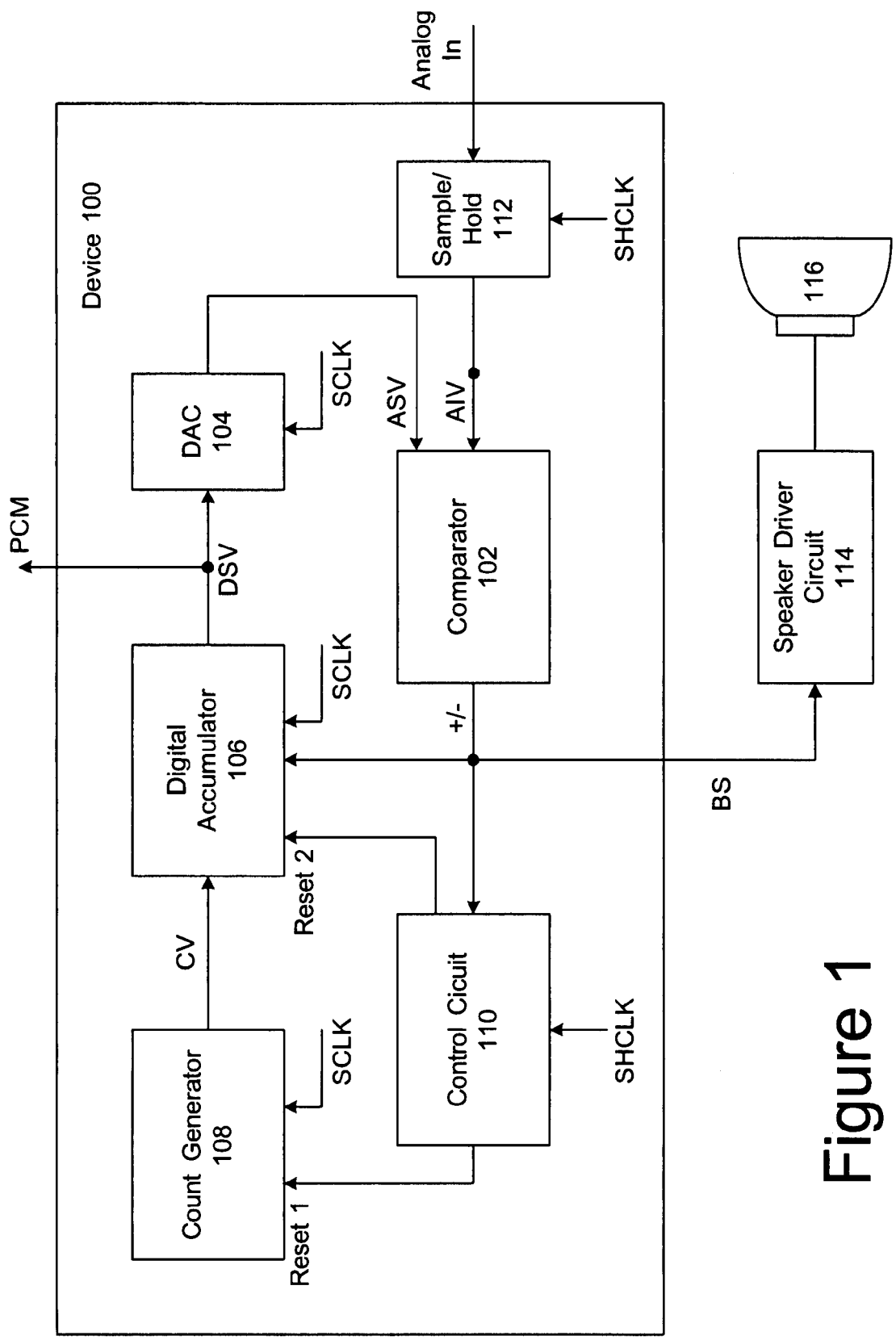
FIG. 1 is a block diagram illustrating a device for converting analog values into digital form, in accordance with an embodiment of the present invention.

FIG. 1 is a block diagram illustrating a device 100 for converting analog values into digital form in accordance with an embodiment of the present invention. The device 100 includes a comparator 102, a digital-to-analog converter (DAC) 104, a digital accumulator 106, a count generator 108, and a control circuit 110. The comparator 102 has inputs, one input being adapted to receive an analog sample value (ASV) and another input being adapted to receive an analog input value (AIV). In one embodiment, ASV and AIV are voltages. In other embodiments, ASV and AIV may be, for example, currents. The comparator 102 is operative to compare ASV and AIV, to determine whether ASV is greater or lesser than AIV, and to output a signal responsive to the comparison.

The DAC 104 is operative to convert a digital sample value (DSV) into an ASV (e.g., to an analog voltage) and to output the ASV to one of the inputs of the comparator 102. The DAC 104 may be any type of circuit adapted to convert a digital value into an analog signal, such as a voltage or current.

The digital accumulator 106 is operative to produce a DSV by adding an input number to or subtracting the input number from its contents, the input number being a count value, CV, received from the count generator 108 described below. The digital accumulator 106 is also adapted to receive a step clock, SCLK, signal and to perform the adding or subtracting on each cycle of the SCLK signal. The digital accumulator 106 is further adapted to output, on each cycle of the SCLK signal, the current DSV to the DAC 104. One skilled in the art will appreciate that the digital accumulator 106 may include an adder and a register, as described with reference to FIG. 4. The digital accumulator 106 may further be adapted to receive a RESET2 signal and to reset its contents to one or more initial values in response thereto. The digital accumulator 106 may be reset, for example, when a new AIV is applied to the comparator 102.

The count generator 108 is operatively coupled to the digital accumulator 106 and is operative to provide a sequence of CVs to the digital accumulator 106. The sequence of CVs may range from a known minimum CV to a maximum CV. The count generator 108 is also adapted to receive the SCLK signal and to generate each CV in the sequence of CVs on each cycle of the SCLK signal. The count generator 108 may further be adapted to receive a RESET1 signal and to reset the CV to its initial value. The reset value of the count generator 108 may be a minimum CV.

In one embodiment, the count generator 108 begins its output sequence at "1" (at an initial count j=1) and counts using an exponential function. The count generator 108 may, for example, count with an exponent of 2 (i.e., $2^{j-1}$) to 2, 4, 8, 16, 32, etc. for j=2, 3, 4, 5, 6, etc. This produces an exponential slew toward a dithering state around the AIV level.

The control circuit 110 is operatively coupled, at its outputs, to the digital accumulator 106 and to the count generator 108 and is operative to provide a reset means (e.g., RESET1 and RESET2 signals) for one or both of the digital accumulator 106 and the count generator 108. At its input, the control circuit 110 is operatively coupled to the comparator 102 and adapted to receive the signal output from the comparator 102. The control circuit 110 is also adapted to receive, at another one of its inputs, an externally supplied clock signal SHCLK. Alternatively, the control circuit 110 is adapted to generate the SHCLK signal internally, for example by producing a pulse when a dithering state (described in further detail herein below) has been reached. The control circuit 110 may further be adapted to control the generation of the SCLK signals based on the SHCLK signal.

The control circuit 110 is adapted to analyze the output of the comparator 102 (i.e., a sequence of outcomes of the comparisons at the comparator 102) and the SHCLK. Based on the analysis, the control circuit 110 is adapted to determine whether the current ASV has overshot of undershoot the AIV and, if so, to instruct the count generator 108 to reset. The AIV overshoots or undershoots the AIV upon two successive unlike outcomes of the comparison at the comparator 102, i.e., when the sign of the outcome from the comparator 102 changes from its prior sign. The control circuit 110 is further adapted to determine whether a new AIV has been acquired as indicated by the SHCLK and, if so, to instruct the digital accumulator 106 to reset.

In some embodiments, the control circuit 110 may be adapted to determine whether three successive unlike outcomes have occurred and, if so, to instruct the digital accumulator 106 to output the same DSV (e.g., the then current DSV) for two or more counts. The same DSV may be output, for example, until a new AIV is received at the comparator 102.

The device 100 is operative to make an initial comparison between the AIV and the ASV held from the last step clock cycle. Based on the comparison, the device 100 generates a next ASV to be used in the next comparison in a recursive convergence process. The next ASV is generated, in its DSV form, by adding or subtracting a count value (CV) to/from the current DSV. Adding is performed by adding the CV multiplied by a positive sign function (e.g., Sign=+1). Subtracting is performed by adding the CV multiplied by a negative sign function (e.g., Sign=−1). The CV increases until the sign function changes from positive to negative (or vice versa), indicating that the AIV level has been overshot (or undershot). The control circuit 110 then instructs the count generator 108 to reset to its initial value (e.g., its starting value), and the next comparison is performed. This process is repeated to eventually converge to a point at which the output from the DAC 104 dithers around the AIV level. The output dithers when the DSVs, separated by one count from the count generator 108, change between two DSV levels, one such level being slightly above and another such level being slightly below the AIV level. The conversion time of the process is dependent on the number of iterations required to resolve those two DSV levels and is proportional to the difference between two successive AIVs. In a typical sampled data system, the minimum sample conversion period is based on the maximum number of iterations needed to transition between two AIV levels.

The device 100 may also include a sample/hold circuit 112. The sample/hold circuit 112 is coupled to the AIV input of the comparator 102. It is adapted to receive an analog signal applied to its input, and a SHCLK signal, and to hold the applied analog signal substantially constant during the conversion time, i.e., the time the device 100 takes to perform the analog-to-digital conversion. A track-and-hold circuit may also be used as input device 112 with appropriate changes in the control circuit.

The device 100 may output a signal to an external system in several ways. A bit-parallel digital PCM signal may be output from the Digital Accumulator 106 DSV signal, for example, or a bit serial signal BS may be output directly from the comparator 102, as indicated in FIG. 1. The external system may, for example, include a speaker 116 coupled to a speaker driver circuit 114. The speaker driver circuit 114 is operative to receive the output of the comparator 102 and to output an electrical signal to the speaker 116. The speaker 116 is operative to convert the electrical signal received from the speaker driver circuit 114 to sound. Other external systems are possible, depending on the application of the device 100.

Figure 2:
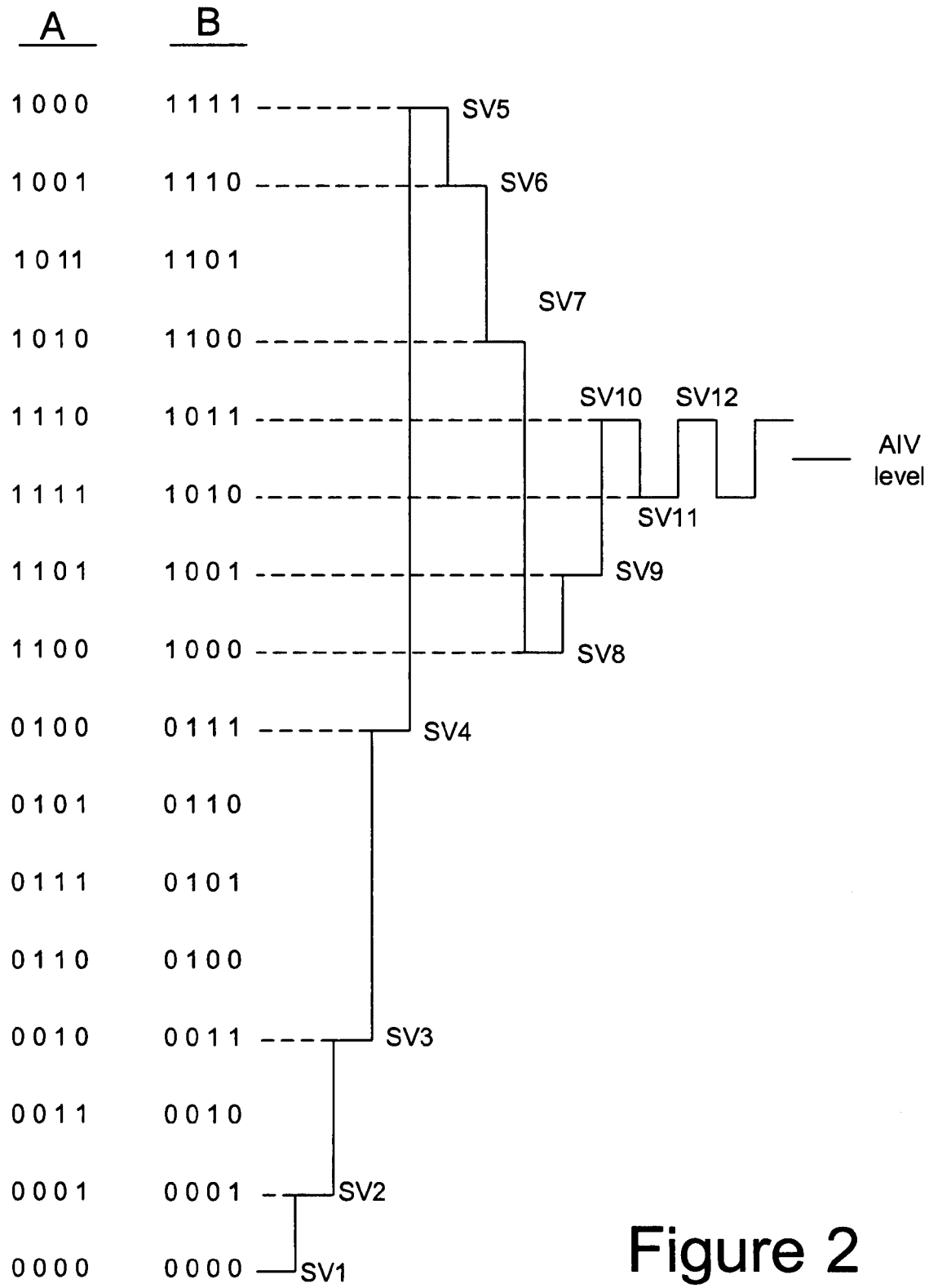
FIG. 2 is a graph illustrating a convergence process in an exponential convergence successive approximation converter, in accordance with an embodiment of the present invention.

FIG. 2 is a graph illustrating a convergence process in an exponential convergence successive approximation converter, in accordance with an embodiment of the present invention. Different binary encoding systems A, B of the possible contents of the digital accumulator 106 may be used. Under system A, the lower limit of the digital accumulator 106 is 0000 and the upper limit is 1000. Under system B, the lower and upper limits are 0000 and 1111, respectively. The system A is characterized by only one bit changing between two adjacent steps. System B is standard binary encoding. The exponential convergence terminates in a dithering state around the AIV level. In the illustrated embodiment, the AIV level is between 1111 and 1110 under system A and between 1010 an 1011 under system B.

In operation, using system B, the digital accumulator 106 starts with a first DSV of 0000 (i.e., DSV1=0000), and the count generator 108 starts with a CV at the initial value, which in this example is one step level. The comparator 102 performs a comparison between the current analog sample value, ASV1 (being DVS1 converted to analog form by the DAC 104), and the AIV level. Here, ASV1<AIV. A next digital sample value, DSV2, is generated by adding or subtracting, based at least on the state of the previous comparison, the count value to/from the current digital sample value DSV1. Because the current analog sample value, ASV1, is below AIV, the count value is added. Thus, DSV2 equals DSV1 plus the count value of one step level, i.e., DSV2 is 0001. In FIG. 2, the notation SVj represent both the analog (ASVj) and digital (DSVj) form of sample value j, based on context.

The process is repeated starting with a comparison between ASV2 and AIV. The outcome is that ASV2 is also below AIV. The count value will therefore again be added (rather than subtracted). A new count value is computed. The count value increases on successive like outcomes. Because both ASV1 and ASV2 are below AIV, two like outcomes occurred, and the count value increase. Counting with an exponent of 2, the count value is doubled from one step level to two step levels. DSV3 is then generated as DSV2 plus the count value of two step levels, i.e., 0011. The process is repeated again, starting with a comparison between ASV3 and AIV. ASV3 is also below AIV, so, again, two successive like outcomes occurred, because ASV2 is also below AIV. The count value is doubled from two to four step levels and added to DSV3 to generate DSV4 as 0111. Repeating the process again yields another successive like outcome, a next count value of eight step levels being added, and a next digital sample value, DSV5, of 1111.

At this point, the comparison between ADV5 and AIV yields that ASV5 is greater than AIV, which is a successive different (unlike) outcome. When there are two successive different outcomes, the count value is reset to the initial value. In this example, the initial value is one step level. Because ASV5 is greater than AIV, the count value is subtracted from DSV5 to generate the next digital sample value, DSV6, of 1110. The process is repeated. ASV6 and ASV5 are both greater than AIV, so, again, there are two successive like outcomes, which means that the count value is increased by counting with an exponent of 2, i.e., to two step levels. Because ASV6 is greater than AIV, the count value is subtracted from DSV6 to generate DSV7 as 1100. ASV7 and ASV6 are both greater than AIV, i.e., two successive like outcomes occurred, and the count value is again increased by counting with an exponent of 2, i.e., to four step levels. DSV8 is generated as DSV7 minus four step levels, i.e., 1000, which, in its analog form, is now below AIV.

Due to the two successive unlike outcomes (ASV7 being greater than but ASV8 being lesser than AIV), the count value is again reset to its initial value of one step level, and DSV9 is computed as DSV8 plus one step level, i.e., 1001. Because ASV9 and ASV8 are both lesser than AIV, there are two successive like outcomes, the count value is increased to two step levels, and DSV10 is computed as DSV9 plus two step levels, i.e., 1011. ASV10 is now greater than AIV, meaning that two successive unlike outcomes occurred so the count value is reset to the initial value of one step level. DSV11 is computed as DSV10 minus one step level, i.e., 1010 which, in its analog form, is lesser than AIV, which means that two successive unlike outcomes occurred. The count value is again reset to one step level, and DSV12 is computed as DSV11 plus one step level, i.e., 1011.

The device 100 has now reached the dithering state around the AIV level. The dithering state is reached when there are three successive changes of the sign function (i.e., addition versus subtraction) applied to the count value in the generation of the next digital sample value. In this example, DSV10, DSV11, and DSV12 include three successive changes of the sign function from +1 (because the count value was added to generate DSV10), to −1, to +1. Continuing with additional (digital and corresponding analog) sample values, e.g., SV13, SV14, etc. (not shown in FIG. 2) yield continued dithering around the AIV level by one step level, i.e., by the initial count value.

Table 1 summarizes the determinations involved in the process.

TABLE 1

| ASVj − 1 | ASVj | Increasing? | Sign(j + 1) | Count Value (CVj + 1) |
|---|---|---|---|---|
| >AIV | >AIV | No | −1 | Increase CVj + 1 |
| <AIV | <AIV | Yes | +1 | Increase CVj + 1 |
| <AIV | >AIV | Yes | −1 | Current analog sample value, ASVj, overshot AIV. Reset CVj + 1 to CVinit |
| >AIV | <AIV | No | +1 | Current analog sample value, ASVj, undershot AIV. Reset CVj + 1 to CVinit |

SVj=1, SVj and SVj+1 denote three successive sample values. Sign(j+1) denotes the sign of the count value, i.e., a sign of +1 indicates that the count value is added to the current digital sample value, DSVj, to generate the next digital sample value DSVj+1. A sign of −1 indicates that the count value, CVj+1, is instead subtracted from DSVj to generate DSVj+1. Thus, DSVj+1=DSVj+Sign(j+1)×CVj+1. The function by which the count value is increased varies. Examples of functions for increasing the count value include linear and non-linear functions. Examples of non-linear functions include exponential and logarithmic functions. The count value may further be increased by a constant amount.

Figure 3A:
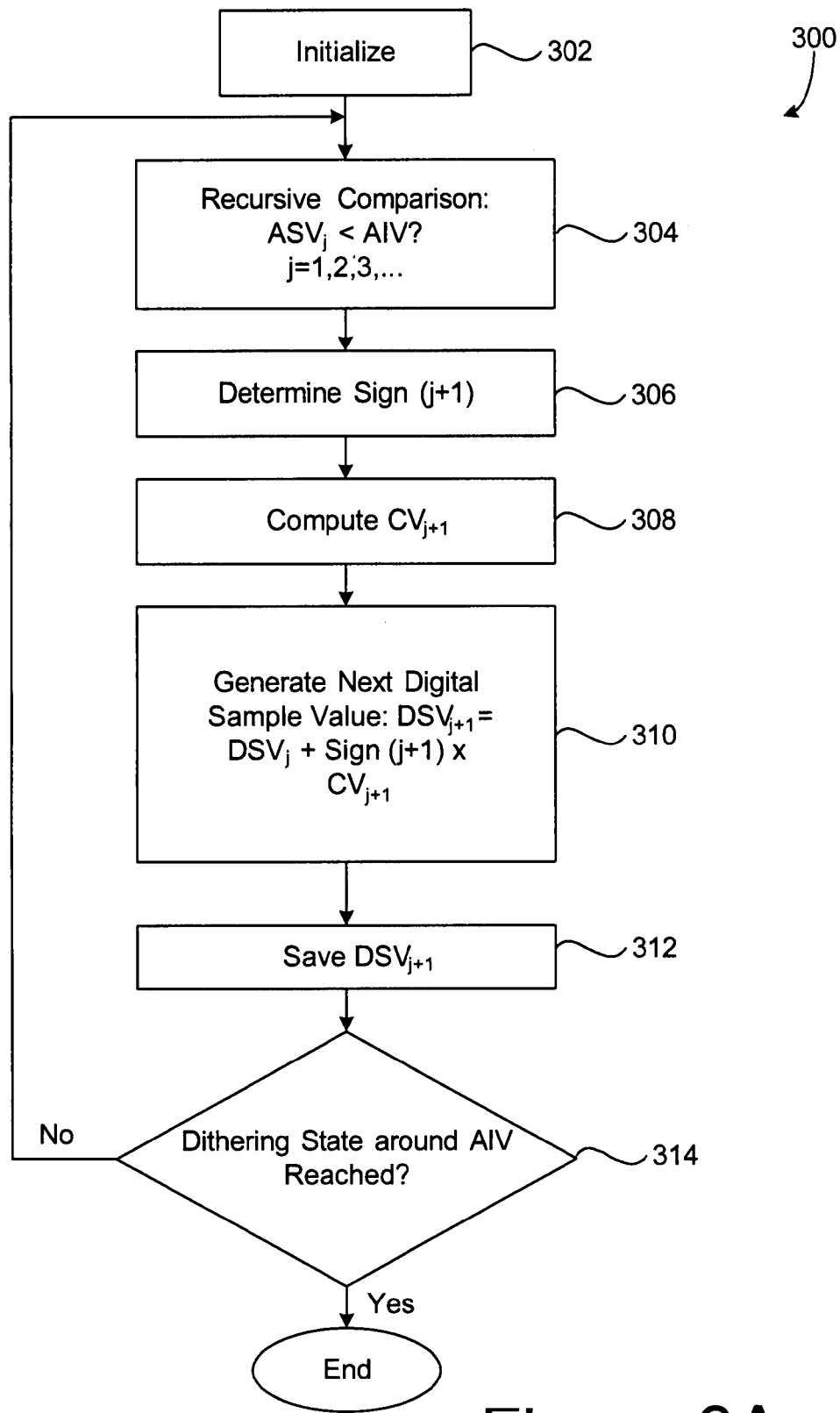
FIG. 3A is a flowchart illustrating a method of converting analog values to digital form, in accordance with an embodiment of the present invention.

FIG. 3A is a flowchart illustrating a method 300 of converting analog values to digital form, in accordance with an embodiment of the present invention. The method 300 starts with an initialize step 302 at which the control circuit 110 issues the RESET1 signal to the count generator 108 to reset its CV to its initial CV, issues the RESET2 signal to the digital accumulator 106 to reset its DSV to the initial DSV, and selects a delta function used in computing the next CV. The method 300 continues with step 304 at which the comparator 102 performs a recursive comparison to determine whether the current analog sample value, ASVj, is below the AIV level. Based on the outcome of the comparison, at step 306, the digital accumulator 106 determines the Sign(j+1) value based on the output from the comparator 102, i.e., whether the next CV is to be added or subtracted from the current DSV to generate the next DSV. Sign(j+1)=+1 if the outcome of the comparison at the comparator 102 did not change in the most recent iteration. Sign(j+1)=−1 if the outcome of the comparison changed in the most recent iteration, indicating that the current ASV undershot or overshot the AIV.

At step 308, the count generator 108 computes the next count value, CVj+1. At step 310, the digital accumulator 106 generates the next digital sample value, DSVj+1, as DSVj+1=DSVj+Sign(j+1)×CVj+1. At step 312, the digital accumulator 106 saves the next digital sample value. Saving may include storing the digital sample value to memory, such as random access memory (RAM), reach only memory (ROM), or the like, or any other type of saving that makes the digital sample values accessible for comparison. At step 314, the control circuit 110 determines whether the dithering state around the AIV level has been reached. The dithering state has been reached when the sign function over three successive iterations (e.g., for j−1, j, and j+1) is either {+1, −1, +1} or {−1, +1, −1}. If not reached, the method 300 then returns to step 304. If reached, the method 300 then ends.

In one embodiment, the method 300 may continue to generate next digital sample values, i.e., steps 304 through 314 may be repeated, after the dithering state has been reached. In another embodiment, the method 300 may end once the dithering state has been reached at step 314. In such an embodiment, the then current sample value (digital and/or analog) may, for example, be repeated, held steady, or the like. The control circuit 110 may control repetition of a particular digital sample value. Returning to FIG. 2, in such an embodiment, SV12 may, for example, be repeated.

In further detail, at step 308, count generator 108 computes the count value as $CVj+1=CVinit+\delta(j)$. The delta function, $\delta(j)$, may be, for example, $\delta(j)=\delta init$ for a constant delta function, $\delta(j)=(j-1)\times a+\delta init$ for a linear delta function (a and $\delta init$ being constants), and $\delta(j)=\Sigma k$ from k=1 to j for a rising delta function. In the example of the rising delta function, $\delta(j)$ equals 1, 3, 6, 10, 15, 21, ..., 253, 276, 300, etc. for j=1, 2, 3, 4, 5, 6, ..., 22, 23, 24, etc. Another example is $\delta(j)=\delta init \times a^{j-1}$ for an exponential delta function (e.g., a=2, $\delta init$=1), resulting in $\delta(j)$ equal to 1, 2, 4, 8, 16, etc. for j=1, 2, 3, 4, 5, etc. Yet another example is $\delta(j)=\ln(j)$ for a logarithmic delta function, j=1, 2, 3, etc. Other delta functions are possible.

At the initialize step 302, the count generator 108 and/or the control circuit 110 may set $\delta init$ and CVinit, and the control circuit 110 may select the delta function $\delta(j)$ from a set of functions available within the count generator 108. At step 302, Sign(j) may be also be set (e.g., to +1), and the control circuit 110 may set DSVj−1 to a DSVinit value for j=1. DSVinit may be zero, as in the example of FIG. 2.

Figure 3B:
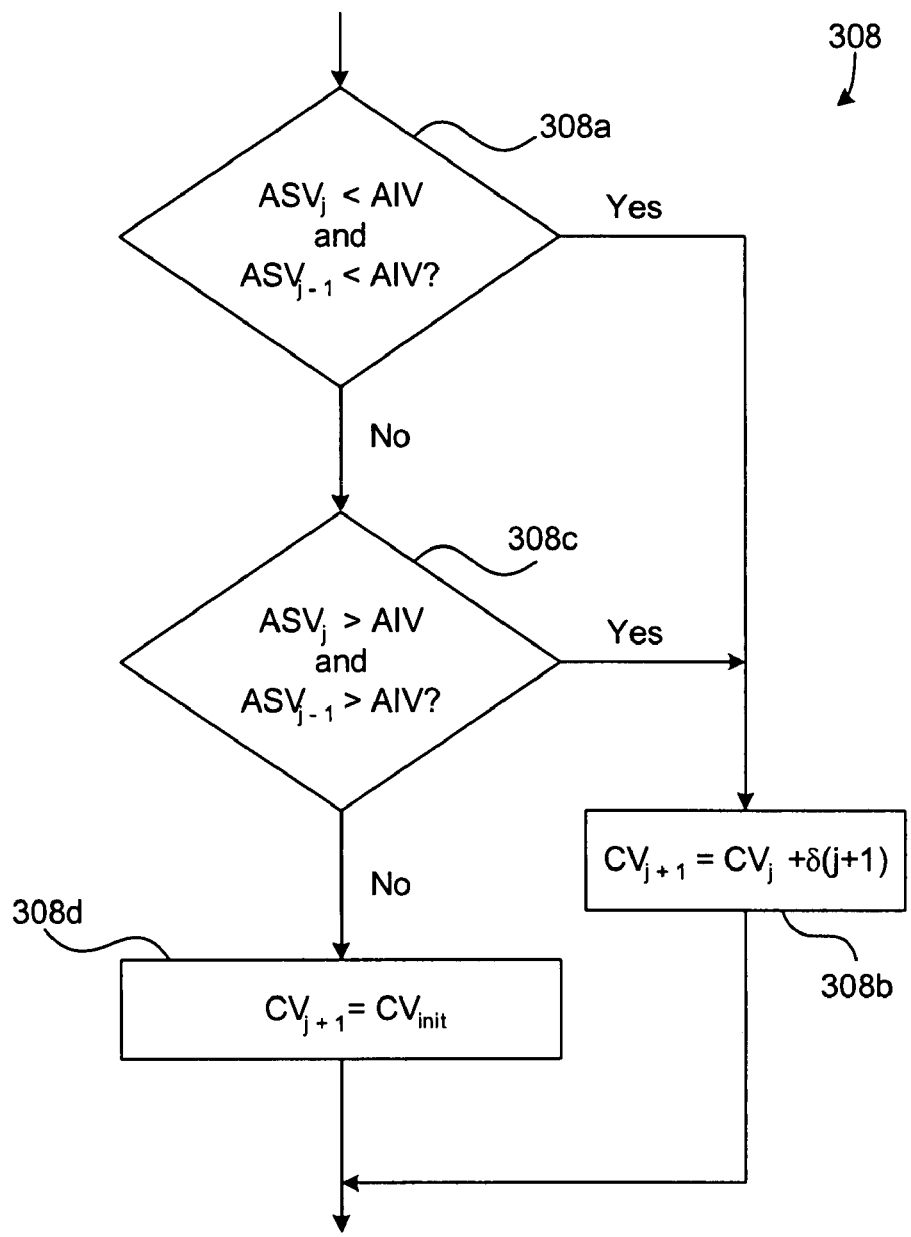
FIG. 3B is a flowchart of the step of computing the count value of FIG. 3A, in accordance with an embodiment of the present invention.

FIG. 3B is a flowchart illustrating details of step 308 of computing the count value of FIG. 3A, in accordance with an embodiment of the present invention. The method steps 308a-d illustrated correspond to the entries in Table 1 and may be implemented differently than shown in FIG. 3B. At step 308a, the control circuit 110 uses the outcomes of two comparisons made at the comparator 102 to determine whether the current and prior ASVs are both lesser than AIV. If so, at step 308b, the count generator 108 computes the count value for the next digital sample values as CVj+1=CVj+δ(j+1), and step 308 is completed. If not, i.e., if both the current and prior ASVs are not lesser than AIV, the step 308 continues at step 308c, at which the control circuit 110 uses the outcomes of two comparisons to determine whether the current and prior ASVs are both greater than AIV. If so, the method continues at step 308b, as described above. If the two comparisons at step 308c yield a false (or "No") result, the ASV has either overshot or undershot the AIV. At step 308d, the control circuit 110 resets the count value to the initial count value, i.e., $CV_{j+1}=CV_{init}$, and step 308 is completed.

Figure 4:
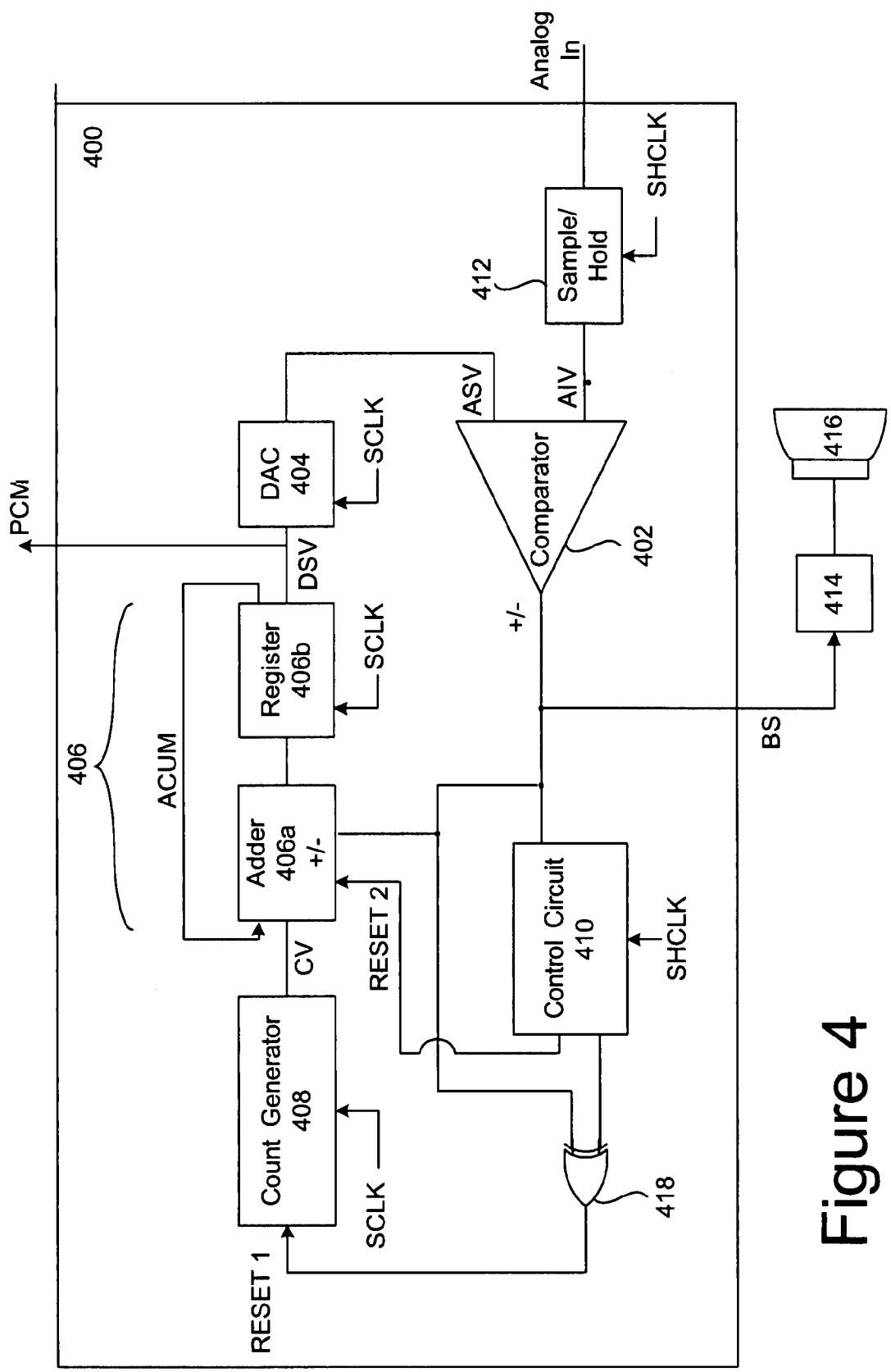
FIG. 4 is a block diagram illustrating a device for converting analog values into digital form, including details of a digital accumulator, in accordance with an embodiment of the present invention.

FIG. 4 is a block diagram illustrating a device 400 for converting analog values into digital form, including details of a digital accumulator, in accordance with an embodiment of the present invention. The device 400 includes a comparator 402, a DAC 404, a digital accumulator 406 comprised of an adder 406a and a register 406b, a count generator 408, a control circuit 410, a sample/hold circuit 412, and an XOR gate 418. The elements 402, 404, 408, 410, and 412 are substantially similar to the corresponding elements 102, 104, 108, 110 and 112 of the device 100 of FIG. 1. The device 400 may be coupled to an external system such as a speaker driver circuit 414 coupled to a speaker 416, which may be substantially similar to speaker 116 and speaker driver circuit 114.

The XOR gate 418 has two inputs, one input adapted to receive the signal output from the comparator 402 and the other input adapted to receive a signal output from the control circuit 410. The XOR gate 418 is operative to output an active (e.g., high) signal when signals applied to its two inputs are different (i.e., one input is high and the other is low). For example, when the output from the comparator 402 changes state, the XOR gate 418 may change state and output a signal to the count generator 408 based on which the count generator 408 may output a count value. When the output from the comparator 402 remains unchanged (e.g., when two successive sample values are both below or both greater than AIV), the XOR gate 418 may change state in response to a change to the one of its inputs coupled to the output from the control circuit 410.

The digital accumulator 406 includes an adder 406a and a register 406b operatively coupled to each other. The adder 406a is operative to add or subtract a count value, CV, received from the count generator 408 and an accumulated count value, ACUM, received via a feedback loop from the register 406b. The adder 406a is coupled to the output of the comparator 402 and adapted to change from addition to subtraction and vice versa corresponding to the sign function when the outcome of the comparison performed by the comparator 402 changes. The adder 406a is adapted to output a next digital sample value, i.e., $DSV_{j+1}$, being $ACUM+Sign(j+1) \times CV_{j+1}$, wherein $CV_j$ is the count value received from the count generator 408, $Sign(j+1)$ corresponds to the signal received from the comparator 402, and ACUM is $\Sigma Sign(k) \times CV_k$ for counts k up to and including the current count, j. The adder 406a is further adapted to be reset to an initial value in response to a RESET2 signal. In some embodiments, the adder 406a receives the RESET2 signal from the control circuit 410. The reset value of the adder 406a may be a lower limit. An example of the lower limit is zero.

The register 406b is operative to store the next digital sample value received from the adder 406a and to feed a new ACUM signal back to the adder 406a. The register 406b is operative to store multiple values, such as prior, current, and next digital sample value, and a prior, current, and next sign value. The register 406b may be operative to also store one or more values of the count value and/or of the delta function, $\delta(j)$.

The count generator 408 is operative to compute and output the value. In some embodiments, the signal output from the XOR gate 418 may be a RESET1 signal operative to reset the count generator 408 to an initial count value. The RESET1 signal may further be operative to reset or otherwise select the function by which the count value is computed (e.g., the $\delta(j)$ function). In some embodiments, the RESET1 signal may comprise multiple reset signals. For example, RESET1a may reset the count value to the initial count value and RESET1b may reset or otherwise select the $\delta(j)$ function from one or more delta functions available (e.g., stored) in the count generator 408.

In some embodiments, the control circuit 410 may include all or part of the functionality of the count generator 408. For example, the control circuit 410 may include functionality to compute the $\delta(j)$ function needed for the computation of the count value. The control circuit 410 may also include functionality of the XOR gate 418. For example, some embodiments may be implemented using a microcontroller or other processor. Such an implementation allows for including the functionality of all or part of, for example, the count generator 408, the control circuit 410, and the XOR gate 418 in the microcontroller.

In some embodiments, elements of the device 400 other than the count generator 408 and the adder 406a may be adapted to be reset to inital values in response to a RESET signal. For example, the register 406b may be adapted to be reset to initial values, such as be set to all zeros or to have its contents erased (not shown). The control circuit 410 may be adapted to generate the RESET signal. In some embodiments, the control circuit 410 may also be adapted to be reset or have its functionality modified, for example, by a system external to the device 400 (not shown). Such reset may include reprogramming of the control circuit 410, for example in an implementation in which the control circuit 410 includes a microprocessor.

In one embodiment, the device (e.g., device 100 or 400) includes a control circuit adapted to prevent the digital accumulator from over-running (i.e., exceed an upper limit) and/or under-running (i.e., fall below a lower limit). One such implementation may include a look-ahead overflow/underflow detector adapted to limit the count value as one or more of the upper and lower limits are approached.

Settling span is the number of step levels between the lowest digital sample value and the highest digital sample value that occur during the process of reaching the dithering state. For example, in FIG. 2, the settling span is 15 steps (between SV1 of 0000 and SV5 of 1111) obtained with four bits of precision. Returning to the rising function, $\delta(j)=\Sigma k$ form k=1, described in connection with FIG. 2, $\delta(24)=300$. Using this $\delta(j)$ function, in order to obtain 24 bit precision, at least 300 steps per conversion are needed. With a step rate of 500 million steps per second, the sample period needs to be at least $300/(500 \times 10^6)=0.6$ microseconds. The sample rate could then be most $1/(0.6 \times 10^{-6})=1.7$ million samples per second (MSPS). Conversion of audio signals at 192 thousand samples per second (KSPS) is therefore within the reach of this method whereas, in comparison, a serial up/down counter approach clocking at the same 500 million steps per second rate would require a worst case conversion time to 24 bits of $(2^{34}/500 \times 10^6)=0.034$ sec, limiting the sample rate to 30 samples per second. With a gated input sample rate of, for example, 96 kHz (i.e., a 10.4 microsecond period), a 24 bit conversion could be done using a 50 MHz step clock. By increasing the number of its, the settling span typically increases. The amount of such increase may depend on the $\delta(j)$ function selected. As may be gleaned from the foregoing calculations, a higher number of bits also typically increases the conversion time, i.e., the settling time allowance.

One possible feature of the device is that it may act as a one-bit digital encoder of an input analog stream (e.g., stream of input values). By transmitting, real-time, the output of the comparator to a remote location, both the input analog stream and its digital representation may be reproduced from the comparator output without requiring a separate clock and without another control signal being propagated with the input analog stream.

Another possible feature of the device is that it may be used to generate a non-monotonic conversion of the analog input with a variable conversion time without violating sampling theory limitation. In an embodiment of the invention, the conversion rate may exceed the input sample/hold rate by, for example, one or two orders of magnitude thereby allowing noise reducing over-sampling techniques to be applied. In such an embodiment, the conversion rate may be a variable determined, for example, by the signal characteristics of the input. Such an embodiment may be a pseudo asynchronous solution. The synchronous aspects of the embodiment may, for example, include the SCLK and SHCLK signals, and the asynchronous aspects may include the conversion rate variable. In an alternate asynchronous embodiment, both the conversion rate and the sample/hold rate can be variable, employing a SHCLK signal internally generated by the control circuit. This can provide superior performance for analog input signals which require occasional long conversion times between generally short conversion times for most of the signal. Non-monotonic timing information (of the SHCLK) can be incorporated, for example, by appropriate coding in the digital signal output, and alternatively a parallel digital timing channel can be provided.

The serial bit stream BS (FIG. 1) can be transmitted to a remote DAC circuit, which can reconstruct the analog input signal at a remote location in an asynchronous manner. In the reconstruction process the sample rate can be determined by detecting the dithering pattern in the bit stream BS. Thus, maintaining a sample reconstruction rate that is limited to the slowest conversion rate is no longer necessary.

The foregoing description of the preferred embodiments of the present invention is by way of example only, and other variations and modifications of the above-described embodiments and methods are possible in light of the foregoing teaching. Although the devices are being described as exponential convergence successive approximation analog-to-digital converters, one skilled in the art will recognize that these devices may be adapted to converge according to any function and may be a part of larger and/or more complex devices. The various embodiments set forth herein may be implemented utilizing hardware, software, or any desired combination thereof. For that manner, any type of logic may be utilized which is capable of implementing the various functionalities set forth herein. Components may be implemented using any data processing element, such as a programmed general-purpose digital computer, using application specific integrated circuits, or using a network of interconnected conventional components and circuits. The embodiments described herein are not intended to be exhaustive or limiting. The present invention is limited only by the following claims.

The invention claimed is:

1. A method for converting analog values into digital form comprising:
    comparing a current analog sample value with an analog input value to produce an outcome;
    generating a count value based on the outcome, the count value increasing upon successive like outcomes and being rest to an initial count value upon successive unlike outcomes;
    adding or subtracting the count value to/from a current digital sample value to generate a next digital sample value, the adding or subtracting being based on the outcome;
    converting the next digital sample value to the current analog sample value; and
    repeating the steps of comparing, generating, adding or subtracting, and converting until the current analog sample value reaches a dithering state around the analog input value.

2. The method of claim 1, wherein the next digital sample value becomes the current analog sample value in a succession iteration of the repeating unless a reset signal is received.

3. The method of claim 1, wherein the dithering state around the analog input value is reached when at least three successive unlike outcomes have occurred.

4. A method for converting analog values into digital form comprising:
    comparing a current analog sample value with an analog input value to produce an outcome;
    generating a count value based on the outcome, the count value increasing upon successive like outcomes and being reset to an initial count value upon successive unlike outcomes;
    adding or subtracting the count value to/from a current digital sample value to generate a next digital sample value, the adding or subtracting being based on the outcome; and
    converting the next digital sample value to the current analog sample value; and
    wherein the count value is computed based on a constant function, a linear function, an exponential function, a logarithmic function, or any combination thereof.

5. A method for converting analog values into digital form comprising:
    comparing a current analog sample value with an analog input value to produce an outcome;
    generating a count value based on the outcome, the count value increasing upon successive like outcomes and being reset to an initial count value upon successive unlike outcomes;
    adding or subtracting the count value to/from a current digital sample value to generate a next digital sample value, the adding or subtracting being based on the outcome; and
    converting the next digital sample value to the current analog sample value; and
    wherein the count value is computed based on a non-monotonic function.

6. A method for converting analog values into digital form comprising:
    comparing a current analog sample value with an analog input value to produce an outcome;
    generating a count value based on the outcome, the count value increasing upon successive like outcomes and being reset to an initial count value upon successive unlike outcomes;
    adding or subtracting the count value to/from a current digital sample value to generate a next digital sample value, the adding or subtracting being based on the outcome; and
    converting the next digital sample value to the current analog sample value; and
    wherein the method selects the step of adding when the analog sample value is less than the analog input value and selects the step of subtracting when the analog sample value is greater than the analog input value.

7. A method for converting analog values into digital form comprising:
- comparing a current analog sample value with an analog input value to produce an outcome;
- generating a count value based on the outcome, the count value increasing upon successive like outcomes and being reset to an initial count value upon successive unlike outcomes;
- adding or subtracting the count value to/from a current digital sample value to generate a next digital sample value, the adding or subtracting being based on the outcome; and
- converting the next digital sample value to the current analog sample value; and
- wherein generating the next digital sample value includes limiting the next digital sample value to below an upper limit, above a lower limit, or both.

8. A method for converting analog values into digital form comprising:
- comparing a current analog sample value with an analog input value to produce an outcome;
- generating a count value based on the outcome, the count value increasing upon successive like outcomes and being reset to an initial count value upon successive unlike outcomes;
- adding or subtracting the count value to/from a current digital sample value to generate a next digital sample value, the adding or subtracting being based on the outcome; and
- converting the next digital sample value to the current analog sample value; and
- wherein generating the count value includes limiting the count value to below an upper limit, above a lower limit, or both.

9. A device for converting analog values into digital form comprising:
- a comparator for comparing a current analog sample value with an analog input value to produce an outcome;
- a count generator for generating a count value based on the outcome, the count value increasing upon successive like outcomes and being reset to an initial count value upon successive unlike outcomes;
- a digital accumulator for receiving the count value and for adding or subtracting the count value to/from a current digital sample value to generate a next digital sample value, the adding or subtracting being based on the outcome;
- a digital-to-analog converter for converting the next digital sample value to the current analog sample value; and
- a control circuit for determining when at least three successive unlike outcomes have occurred, thereby determining that a dithering state around the analog input value has been reached.

10. A device for converting analog values into digital form comprising:
- a comparator for comparing a current analog sample value with an analog input value to produce an outcome;
- a count generator for generating a count value based on the outcome, the count value increasing upon successive like outcomes and being reset to an initial count value upon successive unlike outcomes;
- a digital accumulator for receiving the count value and for adding or subtracting the count value to/from a current digital sample value to generate a next digital sample values, the adding or subtracting being based on the outcome; and
- a digital-to-analog converter for converting the next digital sample value to the current analog sample value; and
- wherein the digital accumulator uses the next digital sample value as the current digital sample value in a successive iteration unless the digital accumulator receives any reset signal.

11. The device of claim 9 wherein the control circuit is adapted for resetting a digital accumulator and the count generator.

12. The device of claim 11,
- wherein the control circuit determines whether the current analog sample value has overshot or undershot the analog input value, and if so instructs the count generator to reset; and
- wherein the control circuit determines whether a new analog input value has been received, and if so instructs the digital accumulator to reset.

13. A device for converting analog values into digital form comprising:
- a comparator for comparing a current analog sample value with an analog input value to produce an outcome;
- a count generator for generating a count value based on the outcome, the count value increasing upon successive like outcomes and being reset to an initial count value upon successive unlike outcomes;
- a digital accumulator for receiving the count value and for adding or subtracting the count value to/from a current digital sample value to generate a next digital sample value, the adding or subtracting being based on the outcome; and
- a digital-to-analog converter for converting the next digital sample value to the current analog sample value; and
- wherein the count generator is adapted for generating the count value based on a linear function, a non-linear function, a constant function, an exponential function, a logarithmic function, or any combination thereof.

14. A device for converting analog values into digital form comprising:
- a comparator for comparing a current analog sample value with an analog input value to produce an outcome;
- a count generator for generating a count value based on the outcome, the count value increasing upon successive like outcomes and being reset to an initial count value upon successive unlike outcomes;
- a digital accumulator for receiving the count value and for adding or subtracting the count value to/from a current digital sample value to generate a next digital sample value, the adding or subtracting being based on the outcome; and
- a digital-to-analog converter for converting the next digital sample value to the current analog sample value; and
- wherein the count generator is adapted for generating the count value based on a non-monotonic function.

15. A device for converting analog values into digital form comprising:
- a comparator for comparing a current analog sample value with an analog input value to produce an outcome;
- a count generator for generating a count value based on the outcome, the count value increasing upon successive like outcomes and being reset to an initial count value upon successive unlike outcomes;
- a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and wherein the device is configured for producing an a non-monotonic conversion of the analog input value with a variable conversion time.

16. A device for converting analog values into digital form comprising:

a comparator for comparing a current analog sample value with an analog input value to produce an outcome;

a count generator for generating a count value based on the outcome, the count value increasing upon successive like outcomes and being reset to an initial count value upon successive unlike outcomes;

a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and wherein the device is configured for encoding a stream of current analog sample values into a single digital bit.

17. A device for converting analog values into digital form comprising:

a comparator for comparing a current analog sample value with an analog input value to produce an outcome;

a count generator for generating a count value based on the outcome, the count value increasing upon successive like outcomes and being reset to an initial count value upon successive unlike outcomes;

a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and wherein the digital accumulator is adapted for generating the next digital sample value subject to an upper limit, a lower limit, or both.

18. A device for converting analog values into digital form comprising:

a comparator for comparing a current analog sample value with an analog input value to produce an outcome;

a count generator for generating a count value based on the outcome, the count value increasing upon successive like outcomes and being reset to an initial count value upon successive unlike outcomes;

a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and wherein the count generator is adapted for generating the count value subject to an upper limit, a lower limit, or both.

19. A device for converting analog values into digital form comprising:

a comparator for comparing a current analog sample value with an analog input value to produce an outcome;

a count generator for generating a count value based on the outcome, the count value increasing upon successive like outcomes and being reset to an initial count value upon successive unlike outcomes;

a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and wherein the digital accumulator adds the count value when the analog sample value is less than the analog input value and subtracts the count value when the analog sample value is greater than the analog input value.

20. A device for converting analog values into digital form comprising:

a comparator for comparing a current analog sample value with an analog input value to produce an outcome;

a count generator for generating a count value based on the outcome, the count value increasing upon successive like outcomes and being reset to an initial count value upon successive unlike outcomes;

a digital accumulator for receiving the count value and for adding or subtracting the count value to/from a current digital sample value to generate a next digital sample value, the adding or subtracting being based on the outcome; and a digital-to-analog converter for converting the next digital sample value to the current analog sample value; and a sample/hold circuit for holding the analog input value constant during a conversion time, the conversion time corresponding to a time required to reach the dithering state around the analog input value.

* * * * *